(12) United States Patent
Takeuchi et al.

(10) Patent No.: US 8,395,725 B2
(45) Date of Patent: Mar. 12, 2013

(54) LIGHT EMITTING MODULE, BACKLIGHT USING THE SAME, AND LIQUID CRYSTAL DISPLAY DEVICE

(75) Inventors: Hajime Takeuchi, Yokohama (JP); Ryo Sakai, Yokohama (JP); Yasumasa Ooya, Chigasaki (JP); Tsutomu Ishii, Yokohama (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 1008 days.

(21) Appl. No.: 12/161,347

(22) PCT Filed: Jan. 17, 2007

(86) PCT No.: PCT/JP2007/000016
§ 371 (c)(1),
(2), (4) Date: Jul. 18, 2008

(87) PCT Pub. No.: WO2007/083521
PCT Pub. Date: Jul. 26, 2007

(65) Prior Publication Data
US 2010/0225849 A1 Sep. 9, 2010

(30) Foreign Application Priority Data
Jan. 19, 2006 (JP) .................................. 2006-011353

(51) Int. Cl.
*G02F 1/1335* (2006.01)
(52) U.S. Cl. ........................................................ 349/62

(58) Field of Classification Search ...................... 349/62
See application file for complete search history.

(56) References Cited

U.S. PATENT DOCUMENTS

| | | | |
|---|---|---|---|
| 6,548,832 B1 | | 4/2003 | Sakamoto et al. |
| 2006/0060983 A1* | | 3/2006 | Saito ............................. 257/780 |
| 2006/0087866 A1* | | 4/2006 | Ng et al. ........................ 362/612 |
| 2006/0097621 A1* | | 5/2006 | Park et al. ...................... 313/485 |
| 2007/0023777 A1* | | 2/2007 | Sonobe et al. ................. 257/103 |
| 2007/0215892 A1* | | 9/2007 | Ishii et al. ........................ 257/98 |
| 2007/0215895 A1* | | 9/2007 | Amoh et al. ..................... 257/99 |

(Continued)

FOREIGN PATENT DOCUMENTS

| | | |
|---|---|---|
| JP | 09 213115 | 8/1997 |
| JP | 10 247748 | 9/1998 |

(Continued)

OTHER PUBLICATIONS

Korean Office Action issued Nov. 30, 2010, in Patent Application No. 10-2008-7020101 (with English-language translation).

*Primary Examiner* — Timothy L Rude
(74) *Attorney, Agent, or Firm* — Oblon, Spivak, McClelland, Maier & Neustadt, L.L.P.

(57) ABSTRACT

A light emitting module 1 includes a substrate 2 having a metal pattern 4 and a plurality of white light emitting devices 3 linearly arranged on the substrate 2. The metal pattern 4 is formed on a portion of 60% or more of an area of the substrate 2. The white light emitting device 3 includes a light emitting diode as a semiconductor light emitting element 5. Light emitted from the semiconductor light emitting element 5 is converted into white light by a light emitting section containing phosphors, and is taken out. The light emitting module 1 emits white light.

12 Claims, 4 Drawing Sheets

U.S. PATENT DOCUMENTS

| | | | |
|---|---|---|---|
| 2008/0100776 A1* | 5/2008 | Miyachi | 349/69 |
| 2008/0106186 A1* | 5/2008 | Ishii et al. | 313/503 |

FOREIGN PATENT DOCUMENTS

| | | |
|---|---|---|
| JP | 2000 258749 | 9/2000 |
| JP | 2000 261041 | 9/2000 |
| JP | 2001 203395 | 7/2001 |
| JP | 2002-156621 | 5/2002 |
| JP | 2004 128393 | 4/2004 |
| JP | 2005 191445 | 7/2005 |
| JP | 2005 197479 | 7/2005 |
| JP | 2005 317881 | 11/2005 |
| KR | 2001-0014669 | 2/2001 |

* cited by examiner

LIGHT EMITTING MODULE, BACKLIGHT USING THE SAME, AND LIQUID CRYSTAL DISPLAY DEVICE

TECHNICAL FIELD

The present invention relates to a light emitting module, a backlight using the light emitting module, and a liquid crystal display device.

BACKGROUND ART

Conventionally, as a light source of a backlight in a liquid crystal display device, and the like, a cold cathode fluorescent lamp (CCFL) is used. However, there are problems such that, when the cold cathode fluorescent lamp is applied as the light source of the backlight, a color reproducibility is poor, and an environmental burden is large since mercury is used. In recent years, there has been developed a light emitting diode (LED) such as a blue light emitting diode and an ultraviolet light emitting diode, and the application of illumination using the LED to the backlight, and the like, has been promoted.

As a method of forming an LED illumination, a method of combining a blue light emitting LED chip with a yellow phosphor, a method of mixing lights of the blue light emitting LED chip, a red light emitting LED chip, and a green light emitting LED chip, and a method of combining an ultraviolet light emitting LED chip (UV-LED) with an RGB phosphor which contains phosphors of three colors consisting of red, green, and blue, are known. Since the former two methods have problems in the color reproducibility, color adjustment, and the like, there is an increasing expectation for the use of the method in which the UV-LED and the RGB phosphor are combined.

The LED has a long operating life and high reliability, and when being used as a light source, its replacement works are reduced, so that it is expected to be used as a component part of various display devices. An LED chip is a semiconductor element which converts electric energy into lights such as ultraviolet light or visible light to emit the light, and an LED lamp is formed by sealing the LED chip with transparent resin. A luminescent color of the LED lamp depends not only on a light emission wavelength of the LED chip, and light in a visible range from blue to red according to an intended use can be obtained by coating a phosphor on a surface of the LED chip or by including a phosphor in the transparent resin sealing the LED chip. Particularly, a white light emitting LED lamp is expected as a light source of a backlight in a liquid crystal display device of in a portable communication device and a PC.

When the LED lamp is applied as the light source of the backlight, a light emitting module is structured by arranging a plurality of LED lamps on a substrate linearly or in a matrix shape. The backlight applying the light emitting module provided with the plurality of LED lamps is classified into a direct-type backlight and a sidelight-type backlight, depending on the arranged position of the light source, and these are used properly according to usage. The sidelight-type backlight is formed by arranging the light emitting module, as a light source, on a side surface to be an incident surface of a light guide plate (refer to Patent Reference 1).

However, in the backlight using the light emitting module, the method of combining the UV-LED and the RGB phosphor has problems such that a light emission efficiency is low, and the luminance differs between portions where the LED lamp is disposed and where it is not, resulting that the uniformity of luminance becomes less as a whole. Further, there is also a problem that the luminance of a light emitting surface becomes insufficient although a desired luminous flux is obtained from the respective LED lamps composing the light emitting module. As a method of eliminating such an insufficiency or nonuniformity of the luminance, it is conceivable to increase the number of LED lamps mounted in the light emitting module to increase the disposition density thereof, but, in this case, the power consumption is inevitably increased.

Patent Reference 1: JP-A 2000-258749 (KOKAI)

DISCLOSURE OF THE INVENTION

An object of the present invention is to provide a light emitting module having a high luminance of a light emitting surface and capable of suppressing a nonuniformity of the luminance. Another object of the present invention is to provide a backlight and a liquid crystal display device capable of enhancing a luminance at a light emitting surface or a display surface and suppressing a nonuniformity of the luminance by using such a light emitting module.

A light emitting module according to an aspect of the present invention includes: a substrate having a metal pattern; and a plurality of white light emitting devices linearly arranged on the substrate, each of the white light emitting devices having a semiconductor light emitting element and a light emitting section which is excited by light from the semiconductor light emitting element to emit white light, in which the metal pattern is formed on a portion of 60% or more of an area of the substrate.

A backlight according to an aspect of the present invention includes the light emitting module according to the aspect of the present invention as a light source. A liquid crystal display device according to an aspect of the present invention includes: the backlight according to the aspect of the present invention; and a liquid crystal display section illuminated by white light emitted from the backlight.

| | Explanation of Numerals and Symbols |
|---|---|
| 1, 12 | LIGHT EMITTING MODULE |
| 2 | SUBSTRATE |
| 3 | WHITE LIGHT EMITTING DEVICE (WHITE LED LAMP) |
| 4 | METAL PATTERN |
| 5 | SEMICONDUCTOR LIGHT EMITTING ELEMENT (LED CHIP) |
| 6 | CONDUCTIVE WIRE |
| 7 | PERIPHERAL MEMBER |
| 8 | REFLECTION LAYER |
| 9 | LIGHT EMITTING SECTION (PHOSPHOR LAYER) |
| 10 | TRANSPARENT RESIN |
| 11 | RGB PHOSPHOR |
| 20 | SIDELIGHT-TYPE BACKLIGHT |
| 21 | LIGHT GUIDE PLATE |
| 22 | REFLECTION LAYER |
| 23 | INCIDENT SURFACE |
| 30 | LIQUID CRYSTAL DISPLAY DEVICE |
| 31 | LIQUID CRYSTAL PANEL |

BEST MODE FOR CARRYING OUT THE INVENTION

Hereinafter, embodiments for conducting the present invention will be explained. A light emitting module according to an embodiment of the present invention has a plurality of white light emitting devices linearly arranged on a substrate having metal patterns. The white light emitting device has a semiconductor light emitting element. For the semiconductor light emitting element, a light emitting diode (LED) element, a laser diode element, or the like, is applied. The white light emitting device converts light emitted from the semiconductor light emitting element into a white color with the use of phosphors, and the like, and takes out the light. As the white light emitting device, a white light emitting LED lamp having an LED element is preferably used.

The metal patterns are formed on a portion of 60% or more of an area of the substrate on which the plurality of white light emitting devices are mounted. By forming the metal patterns on such a large portion accounting for 60% or more of the area of the substrate, it is possible to effectively utilize the metal patterns as reflection layers. For example, in case of structuring a sidelight-type backlight by disposing the light emitting module along an incident surface of a light guide plate, a part of light being emitted from the white light emitting device is reflected by the light guide plate and returned to the light emitting module. By previously providing the metal patterns on such a large portion accounting for 60% or more of the area of the substrate, it is possible to effectively rereflect the light reflected by the light guide plate using the metal patterns.

Therefore, it is possible to enhance the luminance as the light emitting module, and to suppress the difference in luminance between portions where the white light emitting device is mounted and where it is not, resulting that a uniform luminance can be realized as a whole. Further, it is also suppressed that the luminance becomes insufficient although a predetermined luminous flux is generated from the white light emitting device. Based on these, it becomes possible to provide a light emitting module with a sufficient and uniform luminance. The light emitting module of this embodiment is effectively used as a light source of a backlight used in a small-sized to middle-sized liquid crystal display device. Concretely, it is effectively used as a light source of a backlight of a liquid crystal display device having a display screen of 15 inches or smaller.

Figure 1:
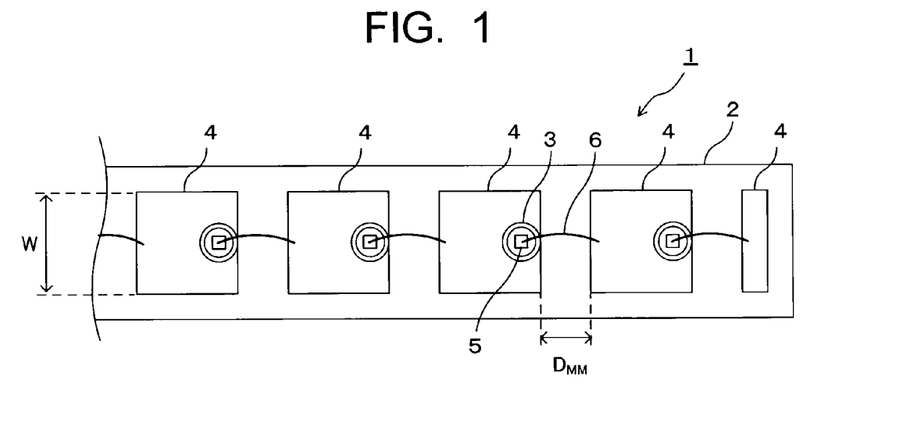
FIG. 1 is a plan view showing a structure of a light emitting module according to a first embodiment of the present invention.
Figure 2:
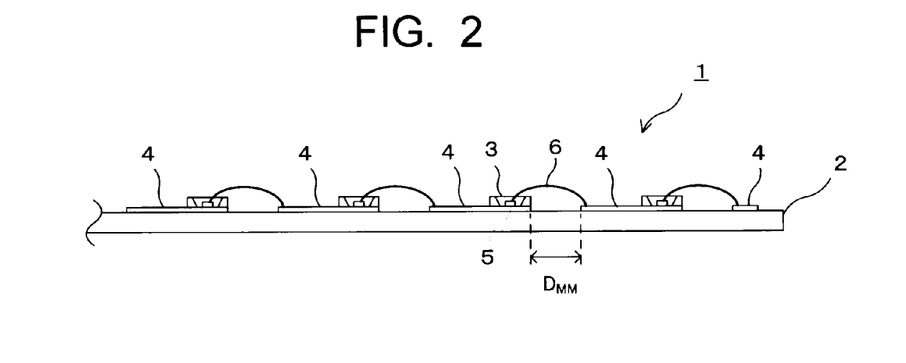
FIG. 2 is a sectional view of the light emitting module shown in FIG. 1.
Figure 3:
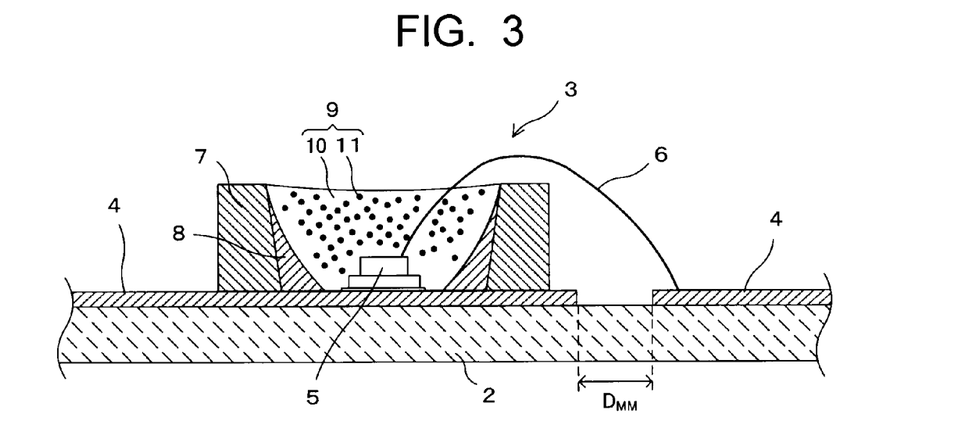
FIG. 3 is a sectional view showing by enlarging a part of a white light emitting device of the light emitting module shown in FIG. 1.

FIG. 1 is a plan view showing a structure of a light emitting module according a first embodiment of the present invention. FIG. 2 is a sectional view of the light emitting module shown in FIG. 1. FIG. 3 is a sectional view showing by enlarging a part of a white light emitting device of the light emitting module shown in FIG. 1. A light emitting module 1 shown in these drawings has a plurality of white light emitting devices 3 linearly arranged on an insulating substrate 2. On a surface of the substrate 2, metal patterns 4 are formed. The metal patterns 4 are formed in a plurality of quadrangular patterns. Each of the plurality of white light emitting devices 3 is mounted on the respective quadrangular metal patterns 4. The metal patterns 4 are formed on a portion of 60% or more of an area of the substrate 2.

In the first embodiment, an area being a total sum of areas of the plurality of quadrangular metal patterns 4 accounts for 60% or more of an area of a main surface (surface on which the plurality of white light emitting devices 3 are mounted) of the substrate 2. The total sum of areas of the metal patterns 4 also includes areas of portions where the white light emitting devices 3 are mounted. Preferably, the metal patterns 4 are formed between at least the plurality of white light emitting devices 3. For instance, when the light emitting module 1 is used as a light source of a backlight, the metal patterns 4 formed between each of the white light emitting devices 3 effectively function as reflection layers.

It is further preferable that the metal patterns 4 are formed on a portion accounting for 80% or more of the area of the substrate 2. By making the occupied area of the metal patterns 4 with respect to the substrate area be 80% or larger, it becomes possible to more effectively enhance the function of the metal patterns 4 as the reflection layers. Although being differed depending on the arrangement numbers or the connecting method of the white light emitting devices 3, the occupied area of the metal patterns 4 with respect to the substrate area can be set up to about 99%. If the occupied area ratio of the metal patterns 4 is beyond 99%, an original function of the metal pattern 4 as a metal wiring layer is impaired. It is allowable that the metal pattern 4 does not function as a wiring layer, but, in such a case, there is a need to separately form a metal layer as a reflection layer and another metal layer as a wiring layer, which increases the manufacturing cost. Accordingly, the metal pattern 4 is preferably a wiring layer which supplies electric power to the white light emitting device 3.

As described above, the white light emitting device 3 has a semiconductor light emitting element 5. Here, the white light emitting device 3 is a white LED lamp in which an LED chip is applied as the semiconductor light emitting element 5. As shown in FIG. 2 and FIG. 3, the LED chip 5 has electrodes respectively formed on an upper portion and a lower portion thereof. A lower electrode of the LED chip 5 is electrically connected to the metal pattern 4, and an upper electrode thereof is electrically connected to another metal pattern 4 adjacent thereto via a conductive wire 6. The lower electrode is preferably bonded onto a gold pad partially provided on the metal pattern 4.

The light emitting module 1 of the first embodiment is integrally and electrically connected as a whole by sequentially and electrically connecting one metal pattern 4 and another metal pattern 4 adjacent thereto. The metal pattern 4 functions as a wiring layer. The substrate 2 is preferably a ceramics substrate possessing a thermal expansion coefficient being substantially the same as that of the LED chip 5. An aluminum nitride (AlN) substrate is suitably used as the substrate 2 because of its good thermal conductivity. The substrate 2, a metal plate and a metal plate, or the like, are bonded together, thereby forming the metal pattern 4. The metal pattern 4 may be a metal film formed by applying a thin film forming method such as a vapor deposition method, a sputtering method, a plating method, or the like.

As shown in FIG. 1, in the light emitting module 1, each of relatively large-sized metal patterns 4 is preferably formed between each of the white LED lamps 3. In FIG. 1, each of the plurality of white LED lamps 3 is mounted on the respective metal patterns 4. The metal pattern 4 serves as both a mounting portion and a wiring portion of the white LED lamp 3, and further, it has a pattern shape which can exist between each of the white LED lamps 3. By effectively reflecting light using the metal pattern 4 being such a portion, it is possible not only to enhance the luminance as the light emitting module 1 but also to uniformize the luminance as an entire module.

The plurality of white LED lamps 3 are preferably arranged so that a linear density of the LED chip 5 is in a range of 0.5 piece/cm or more and 9 pieces/cm or less. The linear density of the LED chip 5 is the number of LED chips 5 being arranged per unit length. When the linear density of the LED chip 5 is less than 0.5 piece/cm, the space between each of the LED chips 5 is too large. Accordingly, even if the metal patterns 4 are provided on such space portions, the luminance cannot be sufficiently improved, and further, the luminance as a whole is likely to reduce uniformity. When the linear density of the LED chip 5 is beyond 9 pieces/cm, the power consumption is increased because of the excess of the number of LED chips 5.

Each of the white LED lamps 3 (LED chips 5) is preferably mounted on the same place of the respective quadrangular metal patterns 4. Concretely, it is preferable to mount the white LED lamp 3 in the vicinity of an end portion of the quadrangular metal pattern 4 in an arrangement direction thereof. As shown in FIG. 1, when the white LED lamps 3 are arranged in a lateral direction, the white LED lamp 3 is preferably mounted in the vicinity of one end portion (right-side end portion, in FIG. 1) of the quadrangular metal pattern 4 in the lateral direction thereof. By thus mounting the white LED lamps 3, it is possible to easily connect the upper electrode of the LED chip 5 with another metal pattern 4 adjacent thereto via the conductive wire 6.

In terms of improving the connectivity of the conductive wire 6, the space ($D_{MM}$) between each of the metal patterns 4 is preferable to be set narrow. Also, in terms of enlarging the area of the metal patterns 4 to thereby increase the portions for reflecting light, the space $D_{MM}$ between each of the metal patterns 4 is preferably set narrow. The space $D_{MM}$ between each of the metal patterns 4 is preferably 3 mm or smaller. When the space $D_{MM}$ is larger than 3 mm, a reflection effect of light at the metal pattern 4 is lowered, and a distance of wire bonding becomes long, which results in lowering the manufacturability. Each of the metal patterns 4 is preferably disposed so as not to contact with each other. Similarly as in the first embodiment, in an embodiment in which a light emitting diode 3 is mounted on the metal pattern 4, the space $D_{MM}$ can be narrowed up to about 0.03 mm.

In terms of the luminance improvement, luminance uniformization, and the like, a length of the metal pattern 4 in a direction orthogonal to an arrangement direction thereof (width W of the metal pattern 4) is preferably set so that the area of the entire metal pattern 4 becomes large. The width W of the metal pattern 4 is preferably set to 0.5 mm or larger. An upper limit of the width W is not necessarily restricted. It is sufficient if the width W of the metal pattern 4 is about 3 mm, for achieving the objects as described above. Further, when the width W of the metal pattern 4 becomes larger than 4 mm, it becomes difficult to reduce the thickness of a sidelight-type backlight, for instance.

The metal pattern 4 serves as a reflection layer, and is also used for supplying electric power to the white LED lamp 3, so that it is preferably formed of a metal material excellent in reflectivity and conductivity. Based on such points, the metal pattern 4 is preferably formed of a metal material containing, as a main component, one kind of element selected from aluminum (Al), silver (Ag), platinum (Pt), titanium (Ti), and nickel (Ni). Further, in order to enhance an adhesiveness to the substrate 2, it is further preferable to provide a titanium (Ti) layer on the substrate 2, and on the titanium (Ti) layer, the metal pattern 4 formed of a metal layer such as aluminum (Al), silver (Ag), and platinum (Pt), is provided. Preferably, a gold pad is previously provided on a position corresponding to the lower electrode of the LED chip 5.

The metal pattern 4 preferably has a surface roughness in a range of 0.01 µM or more and 0.3 µm or more as arithmetic mean roughness Ra (JIS B0601-1994). When the surface roughness Ra of the metal pattern 4 is larger than 0.3 µm, not only a bonding strength between the LED chip 5 and the metal pattern 4 but also a reflectivity of light are lowered. When the surface roughness Ra is smaller than 0.01 µm, an adhesive force between a later-described light emitting section (phosphor layer) of the white LED lamp 3 and the metal pattern 4 is decreased.

The surface roughness of the metal pattern 4 can be controlled by applying, for example, a surface roughening process or mirror polishing. For roughening the surface of the metal pattern 4, a blast process is applied, for instance. It is possible to obtain a desired surface roughness by appropriately selecting a material and a particle size of media used in the blast process. For reducing the surface roughness of the metal pattern 4, it is preferable to apply the mirror polishing. The surface roughening process and the mirror polishing are preferably conducted as a surface treatment with respect to the substrate 2 on which the metal patterns 4 are formed.

Further, since the light emitting module 1 is needed to effectively reflect visible light, it preferably has a reflectivity of 40% or more when light with a wavelength of 550 nm, which is a typical wavelength of the visible light, is irradiated thereto. When the reflectivity of light with a wavelength of 550 nm is less than 40%, the visible light is not reflected sufficiently, resulting that the luminance as the light emitting module 1 becomes insufficient. Such a reflectivity of light can be realized by the metal patterns 4 whose occupied area with respect to the substrate 2 is made to be 60% or larger. Since the reflectivity of the light emitting module 1 is affected by not only the forming area of the metal patterns 4 but also a composing material, the surface roughness, and the like of the metal pattern 4, by appropriately controlling these factors, it is possible to improve the reflectivity.

For the white LED lamp 3 used in the light emitting module 1, one in which a blue light emitting LED chip and a yellow light emitting phosphor (YAG, or the like) are combined, or one in which an ultraviolet light emitting LED chip (UV-LED) and an RGB phosphor containing respective phosphors of red, green and blue, are combined, is applied. Between these two, the latter white LED lamp 3 in which the UV-LED chip and the RGB phosphor are combined, is superior to the former one in color reproducibility and color adjustment, and further, it tends to occur the low luminance, low luminance uniformity, and the like, when being applied to the light emitting module 1. Accordingly, the light emitting module 1 of this embodiment is suitable for using such a white LED lamp 3.

FIG. 3 shows the white LED lamp 3 in which the UV-LED chip and the RGB phosphor are combined. The white LED lamp 3 shown in FIG. 3 is provided with a UV-LED chip 5 having electrodes at an upper portion and a lower portion thereof. The UV-LED chip 5 is mounted on the metal pattern 4, and accordingly, a lower electrode thereof is electrically connected to the metal pattern 4. An upper electrode of the UV-LED chip 5 is electrically connected to another metal pattern 4 adjacent thereto via the conductive wire 6. Note that also an LED chip 5 having two electrodes at an upper portion thereof can be mounted in substantially the same manner on the substrate 2 whose structure is illustrated in FIG. 1.

The UV-LED chip 5 radiates ultraviolet light or purple light with a wavelength in a range of, for example, not less than 360 nm nor more than 440 nm. For the UV-LED chip 5, there can be cited one having, for example, a nitride compound semiconductor layer as a light emitting layer. The UV-LED chip 5 normally has a light emitting surface having an area of 0.09 mm$^2$ or more (0.3 mm×0.3 mm square) and 0.36 mm$^2$ or less (0.6 mm×0.6 mm square). The white LED lamp 3 is provided with the UV-LED chip 5 having such a light emitting area.

In a periphery of the UV-LED chip 5, a peripheral member 7 is provided. The peripheral member 7 is a cylindrical member or a cup member made of resin, for example, and a reflection layer 8 is formed on an internal surface thereof. Depending on the circumstances, the peripheral member 7, or the like may become a reason for lowering the uniformity of the luminance, so that it is possible to be removed, if necessary. As a light emitting section 9, a phosphor layer is filled inside the peripheral member 7, and the UV-LED chip 5 is buried inside the light emitting section 9.

The light emitting section (phosphor layer) 9 has transparent resin 10 being filled inside the peripheral member 7. As the transparent resin 10, silicon resin or epoxy resin is used, for instance. The transparent resin 10 contains RGB phosphors 11 each including a red phosphor, a green phosphor, and a blue phosphor. In other words, the light emitting section 9 has the RGB phosphors 11 dispersed in the transparent resin 10. The light emitting section 9 excites the RGB phosphors 11 with ultraviolet light or purple light radiated from the UV-LED chip 5, to thereby emit white light.

As the respective phosphors of red, green, and blue composing the RGB phosphor 11, publicly known light emitting phosphors of respective colors can be applied. For each of the red phosphor, green phosphor, and blue phosphor, a phosphor which effectively absorbs ultraviolet light or purple light with a wavelength in a range of 360 nm to 440 nm being radiated from the UV-LED chip 5, is preferably used.

As the red light emitting phosphor, there is used an Eu-activated yttrium oxysulfide phosphor, Eu- and Sm-activated lanthanum oxysulfide phosphor, Cu- and Mn-activated zinc sulfide phosphor, or the like. As the green light emitting phosphor, there is used Cu- and Al-activated zinc sulfide phosphor, Eu- and Mn-activated aluminate phosphor, or the like. As the blue light emitting phosphor, there is used an Eu-activated halophosphate phosphor, an Eu-activated aluminate phosphor, or the like. These phosphors are preferable to be appropriately chosen and used in consideration of a color rendering property, uniformity of light emission, and luminous characteristics.

The white LED lamp 3 structured as above preferably has a luminous flux of not less than 1 lumen [lm] nor more than 20 lumens [lm]. When the luminous flux is less than 1 [lm], the luminous flux of the white LED lamp 3 is insufficient, so that when the white LED lamp 3 is used as a backlight, and the like, the luminance of the light emitting surface may become insufficient. When the luminous flux is beyond 20 [lm], in case where the white LED lamp 3 is used as a backlight, and the like, there may be reduced the uniformity of luminance of the light emitting surface.

Figure 4:
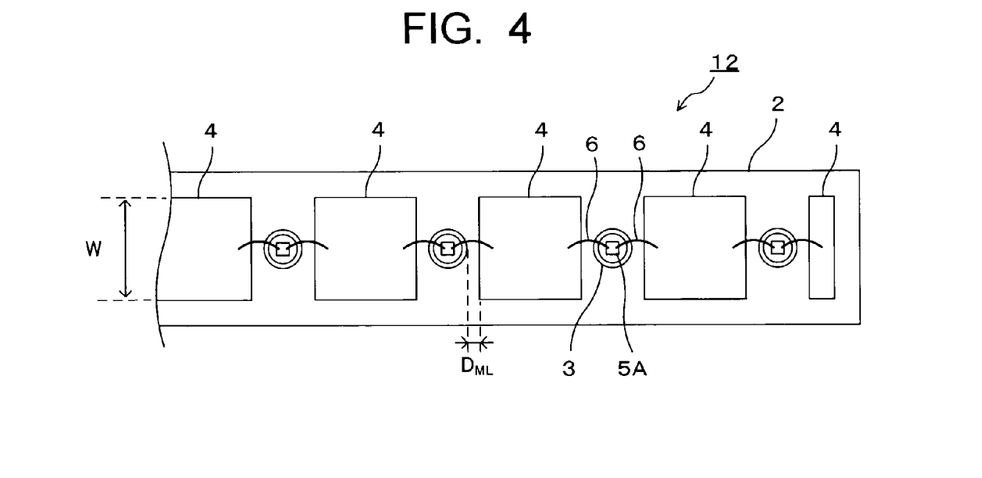
FIG. 4 is a plan view showing a structure of a light emitting module according to a second embodiment of the present invention.
Figure 5:
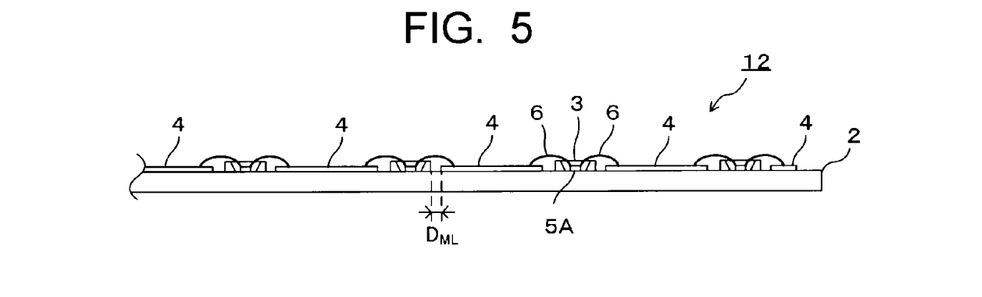
FIG. 5 is a sectional view of the light emitting module shown in FIG. 4.
Figure 6:
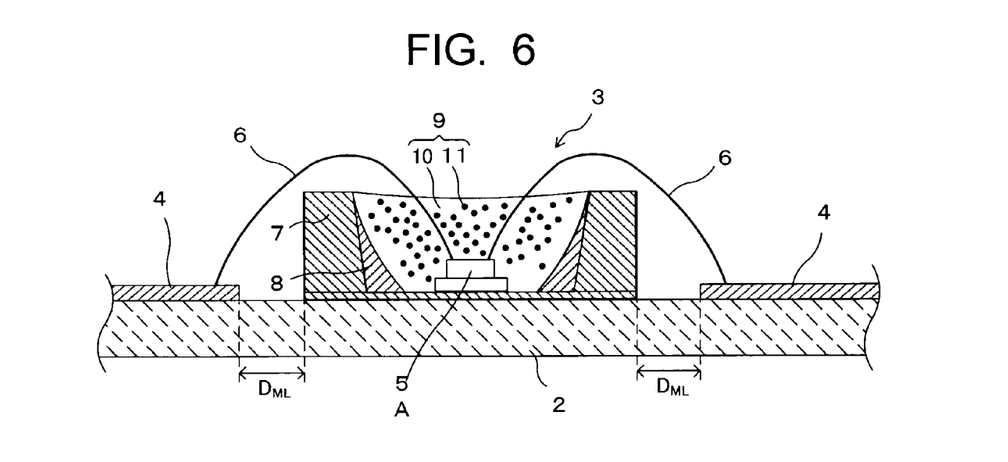
FIG. 6 is a sectional view showing by enlarging a part of a white light emitting device of the light emitting module shown in FIG. 4.

Next, a light emitting module according to a second embodiment of the present invention will be explained. FIG. 4 is a plan view showing a structure of the light emitting module according to the second embodiment. FIG. 5 is a sectional view of the light emitting module shown in FIG. 2. FIG. 6 is a sectional view showing by enlarging a part of a white light emitting device (white LED lamp) of the light emitting module shown in FIG. 1. A light emitting module 12 shown in these drawings has a plurality of white light emitting devices (white LED lamps) 3 linearly arranged on a substrate 2. Metal patterns 4 are formed on a portion of 60% or more of an area of the substrate 2.

In the light emitting module 12 of the second embodiment, the white LED lamp 3 is not mounted on the quadrangular metal pattern 4, and the quadrangular metal pattern 4 is formed only on a portion between each of the white LED lamps 3. Also in the light emitting module 12, the metal patterns 4 are formed on the substrate 2 so that an area being a total sum of areas of the plurality of quadrangular metal patterns 4 accounts for 60% or more of an area of the substrate 2. It is further preferable that the metal patterns 4 are formed on a portion in a range of not less than 80% nor more than 99% of the area of the substrate 2, similarly as in the first embodiment.

The white LED lamp 3 used in the light emitting module 12 is provided with an LED chip 5A having two electrodes at an upper portion thereof. Except that point, the white LED lamp 3 takes the same structure as that of the first embodiment, and a laser diode chip, or the like can be applied instead of the LED chip 5A. As shown in FIG. 5 and FIG. 6, the two electrodes of the LED chip 5A at the upper portion thereof are respectively connected to the metal patterns 4 disposed on both sides thereof via the conductive wires 6. As above, the metal patterns 4 adjacent to each other are sequentially and electrically connected via the white LED lamps 3. The white LED lamps 3 and the metal patterns 4 are integrally and electrically connected as an entire module.

Since the white LED lamp 3 in the second embodiment is disposed between the metal patterns 4 adjacent to each other, as shown in FIG. 5 and FIG. 6, there is a need to sequentially and electrically connect the white LED lamps 3 and the metal patterns 4. Accordingly, there is applied the LED chip 5A having two electrodes at the upper portion thereof, not the one such as the LED chip 5 used in the first embodiment which has the upper electrode and the lower electrode. Except that point, the white LED lamp 3 can be structured in the same manner as in the first embodiment.

Also in the light emitting module 12 of the second embodiment, similarly as in the first embodiment, the plurality of white LED lamps 3 are preferably arranged so that a linear density of the LED chip 5A becomes not less than 0.5 piece/cm nor more than 9 pieces/cm. Further, in terms of the connectivity of the conductive wire 6, the luminance improvement, luminance uniformization, and the like, a space ($D_{ML}$) between the white LED lamp 3 and the metal pattern 4 is preferably set as narrow as possible. The space ($D_{ML}$) is preferably 3 mm or smaller. If the space ($D_{ML}$) is larger than 3 mm, a reflection effect of light at the metal pattern 4 is lowered.

Further, similarly as in the first embodiment, in terms of the luminance improvement, luminance uniformization, and the like, a length of the metal pattern 4 in a direction orthogonal to an arrangement direction thereof (width W) is preferably set so that the area of the metal pattern 4 becomes large. The width W of the metal pattern 4 is preferably set to 0.5 mm or larger. An upper limit of the width W is not necessarily restricted. It is sufficient if the width W of the metal pattern 4 is about 3 mm, for achieving the objects as described above. Further, when the width W of the metal pattern 4 becomes larger than 4 mm, it becomes difficult to reduce the thickness of a sidelight-type backlight, for instance.

In the light emitting module 12 of the second embodiment, the metal patterns 4 formed between the white LED lamps 3 function as reflection layers. Even when the metal patterns 4 are formed only between the white LED lamps 3, it is possible to make the metal patterns 4 effectively function as the reflection layers. Accordingly, it is possible to enhance the luminance of the light emitting module 12 and its uniformity. The metal pattern 4 functions as the reflection layer and the wiring layer also in the light emitting module 12 of the second embodiment, so that the composing material and the condition of the surface roughness of the metal pattern 4 are preferably set in the same manner as in the first embodiment. The same applies to the reflectivity of the light emitting module 12 when light with a wavelength of 550 nm is irradiated thereto.

The light emitting module of the present invention is not limited to the structures in the first and second embodiments, and a structure thereof can be appropriately changed if required, without departing from the scope of the present invention. For instance, although the first and second embodiments have the plurality of quadrangular metal patterns 4, the shape of the metal pattern 4 is not limited to the quadrangle shape. The metal pattern 4 may have a circular shape, an oval shape, or the like. It is allowable if an area being a total sum of areas of the metal patterns 4 accounts for 60% or more of an area of the substrate. Further, the white LED lamps 3 (LED chips 5) are not necessarily arranged perfectly in a linear shape, and may be arranged in zigzags a little.

Next, embodiments of a backlight and a liquid crystal display device according to the present invention will be described. The backlight according an embodiment of the present invention has the light emitting module 1 (12) of the first or second embodiment as a light source. The backlight provided with the light emitting module 1 (12) may be either a direct-type backlight or a sidelight-type backlight, but, it is especially suitably used as the sidelight-type backlight. By applying the light emitting module 1 (12) as the light source of the sidelight-type backlight, the characteristic of the backlight can be further improved.

Figure 7:
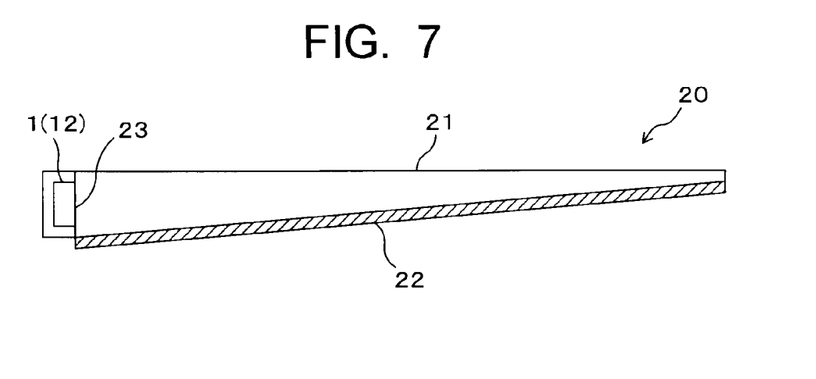
FIG. 7 is a sectional view showing a structure of a backlight according an embodiment of the present invention.

FIG. 7 shows a structure of the sidelight-type backlight according to the embodiment of the present invention. A sidelight-type backlight 20 shown in the same drawing has the light emitting module 1 (12) and a light guide plate 21. The light guide plate 21 is provided with a reflection layer 22. An incident surface 23 is provided on one side surface of the light guide plate 21. The light guide plate 21 is formed in a substantially plate shape in which a thickness thereof gradually decreases from the side surface at a side of the incident surface 23 to the other side surface. The light emitting module 1 (12) is disposed along the incident surface 23 of the light guide plate 21.

Figure 8:
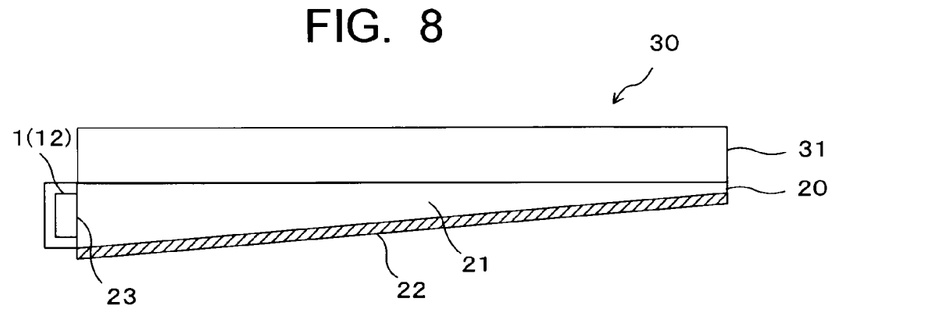
FIG. 8 is a sectional view showing a structure of a liquid crystal display device according an embodiment of the present invention.

FIG. 8 shows a structure of the liquid crystal display device according to an embodiment of the present invention. A liquid crystal display device 30 shown in the same drawing has a flat-shaped liquid crystal panel 31 which serves as a display unit, and the sidelight-type backlight 20 illuminating the liquid crystal panel 31 with white light from the back. The liquid crystal panel 31 is formed such that an array substrate and a color filter substrate each being a glass plate on which transparent electrodes are formed are disposed in an opposed relation to each other between two polarizing plates, for example, and liquid crystal is injected between these substrates, thereby structuring a liquid crystal layer. Color filters of red (R), green (G), and blue (B) corresponding to each pixel are formed on the color filter substrate.

The sidelight-type backlight 20 according to the embodiment of the present invention is provided with the light emitting module 1 (12) as its light source, so that it is possible to enhance the luminance at a light emitting surface (upper surface of the light guide plate 21) and the uniformity of luminance. The liquid crystal display device 30 including such a sidelight-type backlight 20 is excellent in luminous characteristics of its display surface. Therefore, it becomes possible to provide the liquid crystal display device 30 whose display quality, display performance, and the like are improved.

Next, concrete examples of the present invention and evaluation results thereof will be described.

Examples 1 to 11, and Comparative Examples 1 to 2

Here, the light emitting module 1 shown in FIG. 1 was manufactured. First, the plurality of quadrangular metal patterns 4 were formed on the substrate 2 having a length of 177 mm. The plurality of quadrangular metal patterns 4 are formed so that the LED chips 5 have predetermined linear densities when being mounted on the metal patterns 4. The size of the metal pattern 4 is controlled so that an area being a total sum of areas of the metal patterns 4 takes a predetermined area ratio with respect to the area of the substrate 2. Further, the surface roughness (arithmetic mean roughness Ra) of the metal pattern 4 is controlled to be in a predetermined range. The shape, and the like of the metal pattern 4 are as indicated as in Table 1.

Next, The LED chip 5 and the peripheral member 7 were bonded on the metal pattern 4, and further, the upper electrode of the LED chip 5 and the metal pattern 4 adjacent thereto were connected via a bonding wire 6. As the LED chip 5, the UV-LED emitting ultraviolet light with an excitation wavelength of 390 nm was applied. The linear density and the luminous flux of the LED chip 5 are as indicated as in Table 1.

An Eu-activated alkaline earth chlorophosphate phosphor $((Sr_{0.99}Eu_{0.01})_{10}(PO_4)_6.Cl_2)$, Eu- and Mn-activated aluminate phosphor $((Ba_{0.726}Eu_{0.274})(Mg_{0.55}Mn_{0.45})Al_{10}O_{17})$, and an Eu-activated lanthanum oxysulfide phosphor $((La_{0.883}Sb_{0.002}Eu_{0.115})_2O_2S)$ were prepared as a blue phosphor, a green phosphor, and a red phosphor, respectively. Each of these phosphors was mixed in a concentration of 30 mass % with silicon resin, to thereby make slurries of each color. The respective slurries were mixed at a ratio of 20.1 mass %, 19.5 mass %, and 60.4 mass %, and after that, the mixture was dropped inside the respective peripheral members 7, and cured by a thermal treatment under a temperature of 140° C. As such, the light emitting module 1 having the plurality of white LED lamps 3 was manufactured.

In the Examples 1 to 11, and Comparative Examples 1 to 2, the linear density [piece/cm], the number [piece], and the luminous flux [lm] per piece of the white LED lamp 3 arranged on the substrate 2, the area ratio of the metal patterns 4 with respect to the substrate area ((area of the metal patterns 4/area of the substrate 2)×100[%]), a constitutional element and the surface roughness of the metal pattern 4, and the reflectivity of the light emitting module 1 with respect to light with a wavelength of 550 nm, are respectively indicated in Table 1. A measurement of the reflectivity of the light emitting module 1 was performed by a measurement of all reflection components (measurement of a regular reflection component and a diffuse reflection component) by using an integrating sphere.

TABLE 1

| | | LED LAMP | | | METAL PATTERN | | |
|---|---|---|---|---|---|---|---|
| | | LINEAR DENSITY [PIECE/cm] | NUMBER [PIECE] | LUMINOUS FLUX [lm] | AREA RATIO [%] | CONSTITUTIONAL ELEMENT | SURFACE ROUGHNESS Ra [μm] | REFLECTIVITY OF MODULE [%] |

| | | LINEAR DENSITY [PIECE/cm] | NUMBER [PIECE] | LUMINOUS FLUX [lm] | AREA RATIO [%] | CONSTITUTIONAL ELEMENT | SURFACE ROUGHNESS Ra [μm] | REFLECTIVITY OF MODULE [%] |
|---|---|---|---|---|---|---|---|---|
| EXAMPLES | 1 | 0.5 | 9 | 20.0 | 60 | Al | 0.5 | 57 |
| | 2 | 4.5 | 80 | 2.0 | 60 | Al | 0.2 | 57 |
| | 3 | 9 | 159 | 1.0 | 60 | Ag | 0.02 | 57 |
| | 4 | 6 | 106 | 1.5 | 60 | Ni | 0.05 | 40 |
| | 5 | 6 | 106 | 1.5 | 80 | Pt | 0.05 | 56 |
| | 6 | 6 | 106 | 1.5 | 90 | Al | 0.1 | 85.5 |
| | 7 | 0.4 | 7 | 21.2 | 60 | Al | 0.7 | 57 |
| | 8 | 10 | 177 | 0.9 | 60 | Al | 0.05 | 57 |
| | 9 | 9 | 159 | 1.0 | 60 | Au | 0.03 | 33 |
| | 10 | 0.5 | 9 | 20.0 | 60 | Al | 1 | 57 |
| | 11 | 9 | 159 | 1.0 | 93 | Ag | 0.02 | 95 |
| COMPARATIVE EXAMPLES | 1 | 9 | 159 | 1.0 | 50 | Ni | 0.2 | 33 |
| | 2 | 9 | 159 | 1.0 | 40 | Ni | 0.2 | 30 |

Next, the sidelight-type backlights 20 were respectively structured by disposing each of the light emitting modules 1 according to the Examples 1 to 11 and Comparative Examples 1 to 2 along the incident surface 23 of the light guide plate 21, as shown in FIG. 7. The sidelight-type backlight 20 manufactured here is suitably used in a liquid crystal display device of 8 inches. A center luminance and a luminance unevenness at light emitting surfaces of these sidelight-type backlights 20 were measured.

Figure 9:
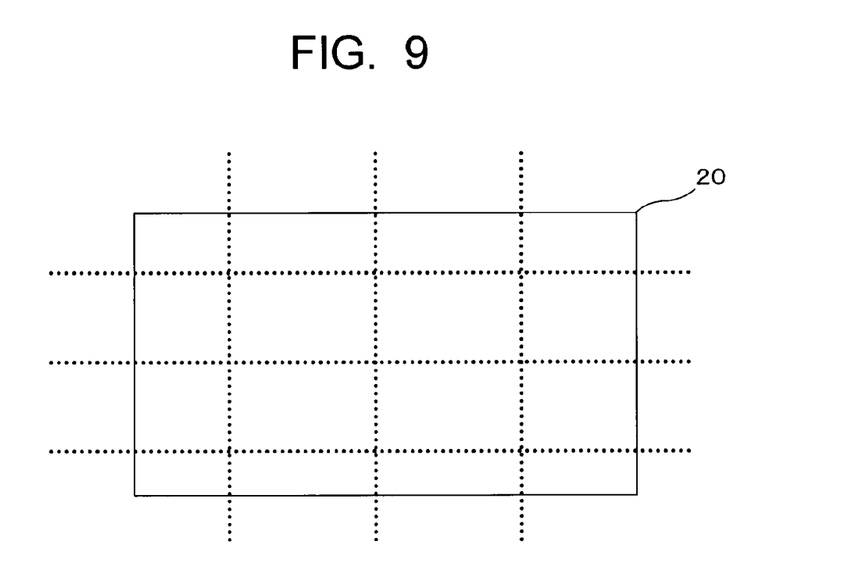
FIG. 9 is a plan view showing measurement points of a luminance in an example of the present invention.
Figure 10:
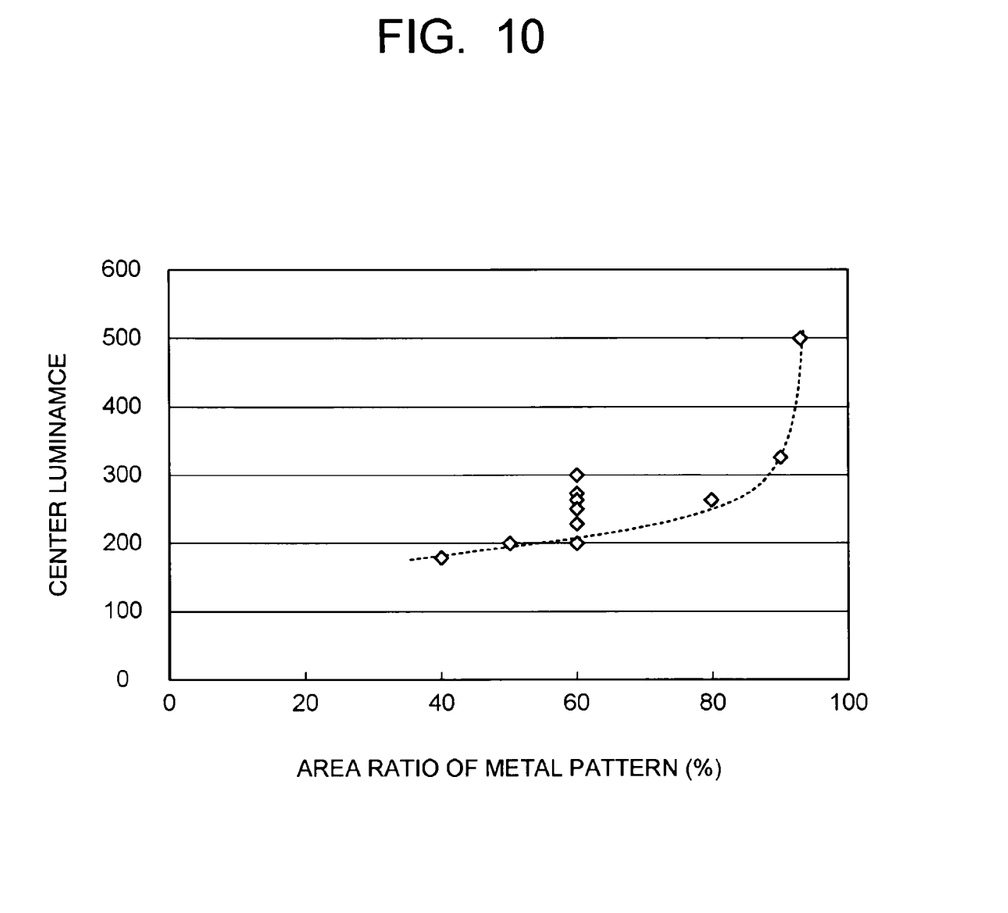
FIG. 10 is a view showing a relationship between an area ratio of metal patterns with respect to a substrate area and a center luminance of a backlight in Examples and Comparative Examples of the present invention.

The measurement of center luminance and luminance unevenness was conducted as follows. When performing the measurement of luminance, center lines were drawn on a center portion of the light emitting surface of the backlight 20 in a vertical direction and in a horizontal direction thereof, and equal dividing lines were respectively drawn on both sides of the center lines, as shown in FIG. 9. Intersection points (9 points) of the vertical lines and the horizontal lines were set as measuring points. The center luminance was measured by measuring the luminance at the intersection point of the center lines in the vertical direction and in the horizontal direction. Each of the luminance at the rest of the 8 points was compared with the center luminance, and the luminance difference having the biggest difference was displayed as the luminance unevenness [%]. Each of the luminance was measured using a luminance meter. These results were shown in Table 2. Further, a relationship between the area ratio of the metal patterns 4 with respect to the substrate area in the light emitting module 1 and the center luminance of the backlight 20 is shown in FIG. 10.

TABLE 2

| | | LUMINOUS CHARACTERISTICS OF BACKLIGHT | |
|---|---|---|---|
| | | CENTER LUMINANCE | LUMINANCE UNEVENNESS [%] |
| EXAMPLES | 1 | 300 | 32 |
| | 2 | 267 | 11 |
| | 3 | 266 | 9 |
| | 4 | 230 | 10 |
| | 5 | 263 | 10 |
| | 6 | 327 | 10 |
| | 7 | 250 | 37 |
| | 8 | 200 | 9 |
| | 9 | 200 | 9 |
| | 10 | 270 | 39 |
| | 11 | 500 | 30 |

TABLE 2-continued

| | | LUMINOUS CHARACTERISTICS OF BACKLIGHT | |
|---|---|---|---|
| | | CENTER LUMINANCE | LUMINANCE UNEVENNESS [%] |
| COMPARATIVE EXAMPLES | 1 | 200 | 9 |
| | 2 | 180 | 9 |

As apparent from Table 2, each of the backlights applying the light emitting module in which the area ratio of the metal patterns with respect to the substrate area is 60% or more obtains the good center luminance, and suppresses the luminance unevenness for the most part. It is further preferable to make the area ratio of the metal patterns be 80% or more. Further, in addition to setting the area ratio of the metal patterns, by respectively setting the linear density of the LED lamp to be in a range of 0.5 to 9 pieces/cm, the luminous flux of the LED lamp to be in a range of 1 to 20 [lm], and the surface roughness Ra of the metal pattern to be in a range of 0.01 to 0.3 μm, it becomes possible that the center luminance takes a more satisfactory value and the luminance unevenness is further suppressed.

INDUSTRIAL APPLICABILITY

With the use of a light emitting module according to an embodiment of the present invention, since metal patterns can be effectively utilized as reflection layers, it is possible to enhance a luminance of a light emitting surface and a uniformity thereof. Such a light emitting module is effectively used in a backlight, and in a liquid crystal display device applying the backlight.

What is claimed is:
1. A light emitting module, comprising:
a ceramic substrate having a surface;
a plurality of metal patterns linearly formed on the surface of the ceramic substrate, each of the metal patterns including a titanium (Ti) layer formed on the surface of the ceramic substrate and a metal layer formed on the titanium layer, which is composed of a metal material containing at least one metal selected from aluminum (Al), silver (Ag), platinum (Pt), and nickel (Ni); and
a plurality of white light emitting devices linearly arranged between the metal patterns on the surface of the ceramic substrate, each of the white light emitting devices including a semiconductor light emitting element including first and second electrodes, and a light emitting portion which is excited by light from the semiconductor light emitting element to emit white light, the first and second electrodes being electrically connected to the metal patterns disposed on both sides of the white light emitting device via first and second conductive wires, and the white light emitting devices being connected in series via the metal patterns and the conductive wires, wherein the metal patterns are formed on a portion of 60% or more of an area of the surface of the ceramic substrate, and have a surface roughness in a range of 0.01 μm or more and 0.3 μm or less as arithmetic mean roughness Ra, wherein a reflectance when irradiating light with a wavelength of 550 nm at the surface of the ceramic substrate having the metal patterns is 40% or more, and wherein the white light emitting devices are arranged so that a linear density of the semiconductor light emitting element is in a range of 0.5 piece/cm or more and 9 pieces/cm or less.

2. The light emitting module according to claim 1, wherein the white light emitting device is provided with the semiconductor light emitting element emitting ultraviolet light or purple light, and the light emitting portion, which is excited by the light from the semiconductor light emitting element to emit the white light, containing a red phosphor, a green phosphor, and a blue phosphor.

3. The light emitting module according to claim 2, wherein the semiconductor light emitting element has a light emission wavelength in a range of 360 nm or more and 440 nm or less.

4. The light emitting module according to claim 1, wherein the semiconductor light emitting element is a light emitting diode or a laser diode.

5. The light emitting module according to claim 1, wherein the semiconductor light emitting element has a light emitting area in a range of 0.09 $mm^2$ or more and 0.36 $mm^2$ or less.

6. The light emitting module according to claim 1, wherein the white light emitting device has a luminous flux in a range of 1 lumen or more and 20 lumens or less.

7. A backlight, comprising: the light emitting module according to claim 1.

8. The backlight according to claim 7, further comprising:
a light guide plate having an incident surface provided at one side surface thereof,
wherein the light emitting module is arranged along the incident surface of the light guide plate.

9. A liquid crystal display device, comprising:
the backlight according to claim 7; and
a liquid crystal display section illuminated by white light emitted from the backlight.

10. The liquid crystal display device according to claim 9, wherein the liquid crystal display section is disposed on a light guide plate, and the light emitting module is arranged along an incident surface provided at one side surface of the light guide plate.

11. The liquid crystal display device according to claim 9, wherein the liquid crystal display section has a display size of 15 inches or smaller.

12. The light emitting module according to claim 1, wherein the ceramic substrate comprises an aluminum nitride based substrate.

* * * * *